United States Patent
Deng et al.

(10) Patent No.: US 9,627,014 B2
(45) Date of Patent: Apr. 18, 2017

(54) MULTIPLE PORT SHARED MEMORY

(71) Applicant: Marvell World Trade Ltd., St. Michael (BB)

(72) Inventors: Suzhi Deng, Sunnyvale, CA (US); John Ming Yung Chiang, San Jose, CA (US)

(73) Assignee: Marvell World Trade Ltd., St. Michael (BB)

(*) Notice: Subject to any disclaimer, the term of this patent is extended or adjusted under 35 U.S.C. 154(b) by 122 days.

(21) Appl. No.: 14/570,886

(22) Filed: Dec. 15, 2014

(65) Prior Publication Data

US 2015/0170720 A1     Jun. 18, 2015

Related U.S. Application Data

(60) Provisional application No. 61/917,229, filed on Dec. 17, 2013.

(51) Int. Cl.
   *G06F 13/10*     (2006.01)
   *G11C 7/10*     (2006.01)
   *G06F 13/16*     (2006.01)

(52) U.S. Cl.
   CPC ........ *G11C 7/1075* (2013.01); *G06F 13/1626* (2013.01); *Y02B 60/1228* (2013.01)

(58) Field of Classification Search
   CPC .............. G11C 7/1075; G06F 13/1626; Y02B 60/1228
   USPC ........................................................ 711/149
   See application file for complete search history.

(56) References Cited

U.S. PATENT DOCUMENTS

| | | | |
|---|---|---|---|
| 6,006,303 A | 12/1999 | Barnaby et al. | |
| 6,594,718 B1 | 7/2003 | Ebner et al. | |
| 2008/0005437 A1 | 1/2008 | Gupta et al. | |
| 2010/0115167 A1* | 5/2010 | Tardieux ............... | G06F 13/362 710/240 |
| 2013/0097390 A1 | 4/2013 | Hatula et al. | |

* cited by examiner

*Primary Examiner* — Jae Yu

(57) ABSTRACT

Some of the embodiments of the present disclosure provide a system comprising: a shared memory unit and an arbiter that is configured to generate a clock signal, receive information regarding bandwidths of each of a plurality of agents, and determine a clock frequency or a sequence for selecting single agents among the plurality of agents to allow the single agents to transfer data in parallel from/to the shared memory unit in a single clock cycle of the clock signal, wherein the sequence is based, at least in part, on the bandwidths for each of a plurality of agents. The arbiter is also configured to cycle through the determined sequence for selecting the single agents among the plurality of agents to allow the single agents to transfer data from/to the shared memory unit in the single clock cycles.

22 Claims, 5 Drawing Sheets

MULTIPLE PORT SHARED MEMORY

CROSS REFERENCE TO RELATED APPLICATIONS

This claims priority to U.S. Provisional Patent Application No. 61/917,229, filed on Dec. 17, 2013, entitled "Multiple-port Shared Memory with Port Base Programmable Bandwidth," which is incorporated herein by reference.

TECHNICAL FIELD

Embodiments of the present disclosure relate to memory devices, and more particularly to shared memory devices.

BACKGROUND

Unless otherwise indicated herein, the approaches described in this section are not prior art to the claims in the present disclosure and are not admitted to be prior art by inclusion in this section.

Memory devices are employed in many types of electronic devices, such as computers, cell phones, personal digital assistants (PDAs), data loggers, and navigational equipment, just to name a few examples. Among such electronic devices, various types of nonvolatile memory devices may be employed, such as NAND or NOR flash memories, static random access memory (SRAM), dynamic random access memory (DRAM), and phase-change memory, just to name a few examples. In general, writing or programming processes may be used to store information in such memory devices, while a read process may be used to retrieve stored information.

In some applications, a memory device may be shared among multiple central processing units (CPUs) and information processors (IPs). Information stored on such a shared memory device may be exchanged among the multiple CPUs and IPs. A system on a chip (SOC) is an integrated circuit (IC) that integrates multiple components of a computer or other electronic system into a single chip substrate. A SOC may include a shared memory device and multiple CPUs that access the shared memory device for data communication. Accessing the shared memory device with round-robin arbitration, for example, through a shared port may have long and unpredictable latency. A more efficient technique for sharing a memory device among multiple CPUs in a system can result in increased system bandwidth and reduced power consumption.

SUMMARY

In various embodiments, the present disclosure provides a system comprising a shared memory unit and an arbiter, which may be referred to as a timeslot arbiter or scheduler, but hereinafter called an "arbiter". The arbiter is configured to generate a clock signal, receive information regarding bandwidths of each of a plurality of agents, and determine a sequence for selecting single agents among the plurality of agents to allow the single agents to transfer data in parallel from/to the shared memory unit in a single clock cycle of the clock signal. The sequence is based, at least in part, on the bandwidths of each of the plurality of agents. The arbiter is further configured to cycle through the determined sequence for selecting the single agents among the plurality of agents to allow the single agents to transfer data from/to the shared memory unit in the single clock cycle.

In some embodiments, a method comprises: generating a clock signal; receiving information regarding bandwidths for each of a plurality of agents; and determining a sequence for selecting single agents among the plurality of agents to allow the single agents to transfer data in parallel from/to a shared memory unit in a single clock cycle of the clock signal. The sequence is based, at least in part, on the bandwidths of each of the plurality of agents. The method further comprises cycling through the determined sequence for selecting the single agents among the plurality of agents to allow the single agents to transfer data from/to the shared memory unit in the single clock cycle.

In some embodiments, a computer-readable storage medium storing computer-executable instructions that, when executed by a processor, configure the processor to perform operations comprising: generating a clock signal; determining a sequence for selecting single agents among a plurality of agents to allow the single agents to transfer data in parallel from/to a shared memory unit in a single clock cycle of the clock signal, wherein the sequence is based, at least in part, on bandwidths of each of the plurality of agents; and cycling through the determined sequence for selecting the single agents among the plurality of agents to allow the single agents to transfer data from/to the shared memory unit in the single clock cycle.

BRIEF DESCRIPTION OF THE DRAWINGS

In the following detailed description, reference is made to the accompanying drawings which form a part hereof wherein like numerals designate like parts throughout, and in which is illustrated by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

A shared memory unit (SMU) may be shared by multiple central processing units (CPUs) or hardware IPs (e.g., media control units), hereinafter referred to as "agents". For example, multiple agents may access an SMU through a bus shared by the multiple agents (e.g., a "shared bus") to read from or write to the SMU. In some embodiments, only one agent may access the SMU at a time. Accordingly, a memory arbiter module, which may be referred to as a timeslot arbiter or scheduler, but hereinafter called an "arbiter", may be used to coordinate which among multiple agents can access the SMU at any particular time. The arbiter may perform such coordination based on a number of factors such as, for example, bandwidths of each of the agents and the width of a bus between the arbiter and the SMU. Herein, width of a bus may be defined to be the number of individual electrical conductors or lines (e.g., wires) included in the bus. For example, a 128-bit wide bus may include 128 lines, which individually carry one bit of data. Bandwidth of an agent may be defined to be the average number of bits of data that are transferred to or from the agent in a single time unit, such as a clock cycle. In some cases, bandwidth of an agent may also be defined to be the number of individual electrical connections (e.g., pins) of an output port and/or input port of the agent. For example, an agent may have a bandwidth of 32 bits if the agent has an input port and/or output port that is 32 bits wide. The agent may perform either a read or a write operation every clock cycle or other unit of time, such as every nanosecond (if a nanosecond is the reference time unit selected for the system). In another example, an agent may have a bandwidth of 32 bits if the agent is connected to an external entity, such as a system bus, an arbiter, or a memory device, via a 64-bit wide cable or bus, and a read or write operation may be performed every 2 nanoseconds. Claimed subject matter, however, is not limited in these respects.

Figure 1:
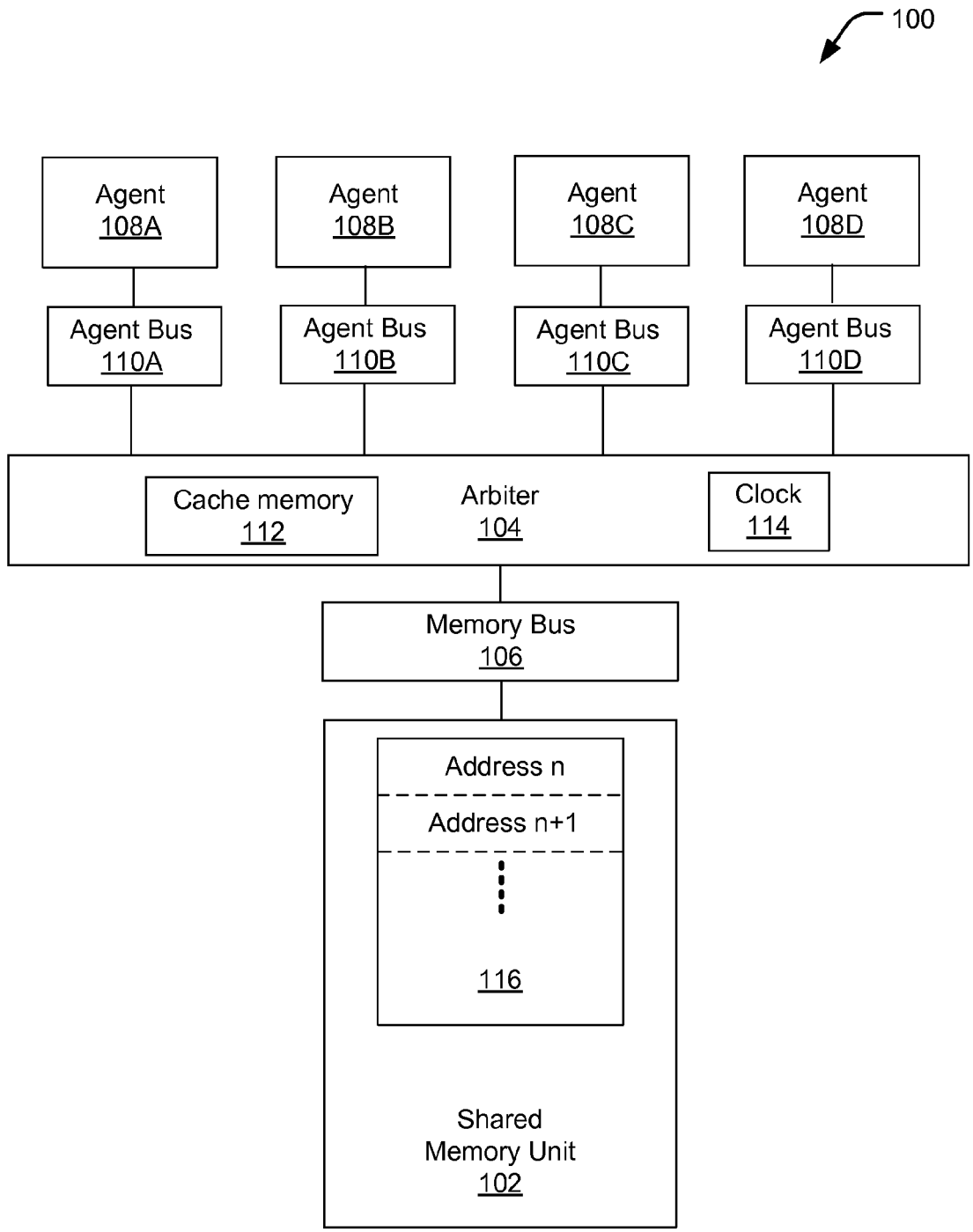
FIG. 1 is a block diagram of a computing system, according to some embodiments.

FIG. 1 illustrates a computing system 100 incorporating an SMU 102 and an arbiter 104, according to various embodiments. SMU 102 may comprise flash memory, SRAM, DRAM, or a solid state drive (SSD), just to list a few examples. Computing system 100 includes a memory bus 106 that provides a communication path between SMU 102 and arbiter 104. Computing system 100 also includes multiple agents 108A-108D. Though four agents are illustrated in FIG. 1 and described in a number of embodiments herein, any number of agents may be present in computing system 100, and claimed subject matter is not limited in this respect. Agents 108A-108D may individually comprise one or more processors, for example. In some implementations, agents 108A-108D may communicate (e.g., transfer data) with arbiter 104 via agent buses 110A-110D. The width of an agent bus may depend, at least in part, on a particular design of an agent, and bandwidth of the agent bus and the bandwidth of the agent may or may not equal one another. For example, if the bandwidth of agent 108A is 32 bits, the width of the agent bus for agent 108B can be 64 bits. Bandwidths of each of agents 108 may or may not equal one another.

Though not illustrated, computing system 100 may include other components, such as display devices, input devices, and networking devices.

In some implementations, SMU 102 may comprise a single chip or die. In other implementations, SMU 102 may comprise a multi-chip module or multiple discrete components that form a chip set. In some implementations, computing system 100 may be implemented on a single chip in a single package, though claimed subject matter is not so limited.

Arbiter 104 may comprise one or more processors or a memory controller 112, and may be incorporated into SMU 102 as a single chip or as a separate component capable of exerting control over SMU 102. Arbiter 104 may be configured to control a number of processes performed on SMU 102, such as formatting addressable data locations, partitioning memory cells or blocks of volatile or nonvolatile memory, storing data, reading data, and erasing data. In a traditional round-robin arbiter, each agent may access memory when the agent's request is granted, while other agents need to wait until the granted agent has finished its current transaction with the memory. The wait cycle can be any number of cycles depending, at least in part, on the burst size of their transaction. Thus, latency may be unpredictable and can be relatively large. On the other hand, (timeslot) arbiter 104 may control the timeslot associated with each agent such that each agent may access memory when that agent's time-slot gets hit. In other words, the agent that gets hit need not wait other agents. This approach allows each agent to have access to memory independently of one another, and to maintain fixed worst latency for read operations by cycling through the determined sequence.

In various embodiments, arbiter 104 may be configured to control or adjust the number of timeslots associated with each agent. For example, arbiter 104 may adjust the timeslots associated with agent 108A to be 0, 4, agent 108B to be 1, agent 108C to be 2, 5, and agent 108D to be 3, for a total of six timeslots.

Arbiter 104 may include cache memory 112 and a clock 114. Cache memory 112 may comprise any of a number of types of volatile or nonvolatile memory. Cache memory 112 may receive and temporarily store data from agents 108 via agent buses 110 during a process of writing to SMU 102. On the other hand, cache memory 112 may receive and temporarily store data from SMU 102 via memory bus 106 during a process of reading from SMU 102. Clock 114 may generate a periodic electronic signal asynchronously with any other clocks in computing system 100, such as clocks associated with agents 108, for example. In some implementations, to simplify system design, clock 114 may be synchronous with the clock for SMU 102.

Figure 2:
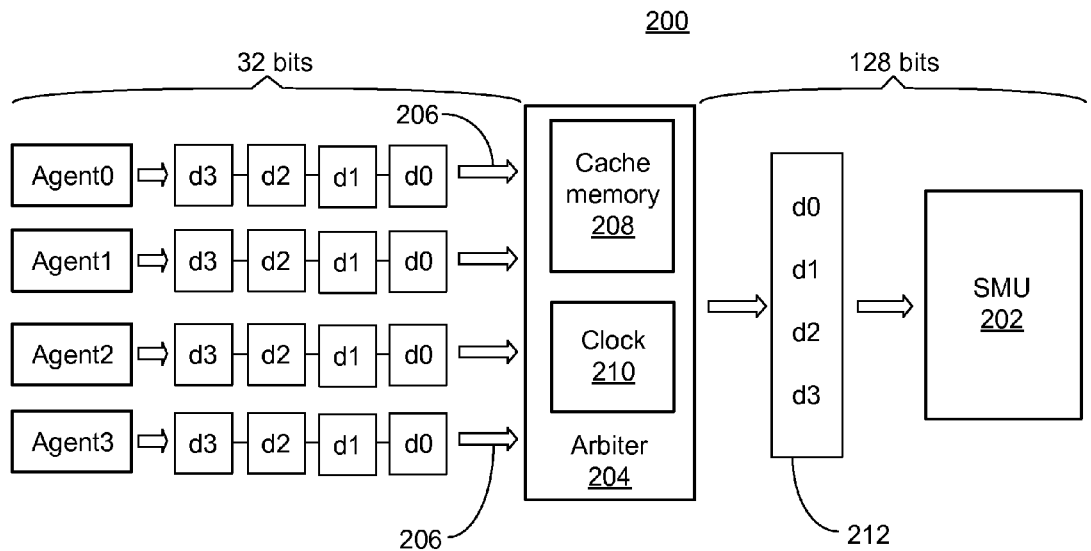
FIG. 2 is a block diagram illustrating data transfer for a process of writing data to a shared memory unit, according to some embodiments.

FIG. 2 is a block diagram illustrating data transfer in a system for a process 200 of writing data to an SMU 202, according to some example embodiments. One or more of the elements of the system illustrated in FIG. 2 may be the same as or similar to corresponding elements illustrated in system 100 of FIG. 1. For example, each of agent0 through agent3 may be the same as or similar to each of agents 108. Arbiter 204 may be the same as or similar to arbiter 104. SMU 202 may be the same as or similar to SMU 102, and so on. In process 200, each of agent0 through agent3 may comprise one or more processors that produce data d0-d3 to be written to SMU 202. Each of agent0 through agent3 provides data d0-d3 via an agent bus 206 to arbiter 204. Each agent bus 206 is dedicated to carrying data for a particular one of agent0 through agent3. Though claimed subject matter is not limited to any particular bus width or processor bandwidth, process 200 is a particular example implementation where each of agent buses 206 is 32 bits wide and each of agent0 through agent3 has a bandwidth of 32 bits. In other words, each of agent0 through agent3 produces data that is 32 bits wide per time unit. Each agent0 through agent3 may place the 32-bit wide (e.g., parallel) data onto agent bus 206.

For sake of clarity, process 200 is described in particular detail for agent0. It is to be understood that the following description for agent0 applies to agent1, agent2, agent3, and any other agents that may be included in system 100.

Data from agent0 may be provided to arbiter 204 in successive 32-bit wide data packets via agent bus 206. Four of such data packets are illustrated as data d0 through d3 on agent bus 206, though any number of data packets may be present at any particular time on agent bus 206. Thus, arbiter 204 may receive data d0 (32 bits) followed by data d1 (32 bits), and so on. In some implementations, arbiter 204 may include a cache memory 208 to receive and temporarily store data from agent0 via agent bus 206 during a process of writing to SMU 202. In some implementations, cache memory 208 may store more than data d0-d3 at any particular time. Cache memory 208 may comprise any of a number of types of volatile or nonvolatile memory.

Arbiter 204 may include a clock 210 to generate a periodic electronic signal asynchronously with any clocks associated with agent0, for example. Arbiter 204 may perform a number of processes based on the clock signal of clock 210. In some implementations, clock 210 may be synchronous with one or more components (e.g., CPU's, other memory) to which arbiter 204 is connected (e.g., wired or wirelessly).

Based, at least in part, on bandwidths of agent0 through agent3, arbiter 204 may be configured to control or adjust the clock or width of addressable data stored in SMU 202. For example, arbiter 204 may adjust the widths of data stored in SMU 202 to be 32 bits wide. In other words, one memory address may be used to uniquely identify 32 bits of data stored in SMU 202. In another example, if arbiter 204 adjusted the width of data stored in SMU 202 to be 128 bits wide, then one memory address could be used to uniquely identify 128 bits of data stored in SMU 202. Moreover, based, at least in part, on bandwidths of agent0 through agent3, arbiter 204 may be configured to control or adjust the width of memory bus 212. For example, arbiter 204 may assemble the four 32-bit data packets of data d0 through d3 into a single data packet that is 128 bits wide (four multiplied by 32). Before placing the 128-bit data packet onto memory bus 212, arbiter 204 may configure memory bus 212 to carry the 128-bit data packet in a single clock cycle (e.g., based on clock 210) to SMU 202. Accordingly, memory bus 212 may be 128 lines wide. In some implementations, the number of lines of memory bus 212 may be greater than the width of data being carried over memory bus 212. In such a case, arbiter 204 may control the number of lines of memory bus 212 to be used to carry data to/from SMU 202.

Arbiter 204 allows one agent at a time to access SMU 202 based, at least in part, on a timeslot scheme. For example, agent1 may access SMU 202 at timeslot 1 while agent0 may access SMU 202 at timeslot 0. Arbiter 204 determines which of the plurality of agents is granted access to SMU 202 at a particular timeslot value. Timeslot value may increase every clock cycle and may loop back to 0 when a maximum value is reached. Each access period for each agent allows a particular number of parallel data bits from the agent to pass through to SMU 202 via memory bus 212. In the present example embodiment, arbiter 204 allows data d0 through d3 for agent0 to pass through (e.g., to be written to) SMU 202.

Before data d0 through d3 can be placed onto memory bus 214, however, arbiter 204 assembles the four 32-bit wide packets of data d0 through d3 into a single 128-bit wide data packet. In other words, all 128 bits of data are placed in parallel with one another, and are subsequently placed onto memory bus 212. As illustrated in FIG. 2, the system to the left of arbiter 204 is based on 32-bit data width, while the system to the right of arbiter 204 is based on 128-bit data width.

Generally, there may be more than data d0 through d3 to be written to SMU 202 from agent0. Arbiter 204 may grant agent0 access to SMU 202 long enough (e.g., one clock cycle) for data0 through d3 to be written to SMU 202. Additional data may be written to SMU 202 after arbiter 204 grants other agents access to SMU 202. Thus, for example, after data d0 through d3 of agent0 is written to SMU 202, arbiter 204 may grant agent1 access to SMU 202. Data d0 through d3 of agent1 may then be written to SMU 202. Next, after data d0 through d3 of agent1 is written to SMU 202, arbiter 204 may grant agent2 access to SMU 202. Data d0 through d3 of agent2 may then be written to SMU 202. Next, after data d0 through d3 of agent2 is written to SMU 202, arbiter 204 may grant agent3 access to SMU 202. Data d0 through d3 of agent3 may then be written to SMU 202. Next, after data d0 through d3 of agent3 is written to SMU 202, arbiter 204 may begin to repeat a cycle of granting agents access to SMU 202 and again grant agent0 access to SMU 202. A new set of data d0 through d3 of agent0 (as compared to data d0 through d3 of agent0 already written to SMU 202 in the first grant cycle) may then be written to SMU 202. Next, agent1 is granted access to SMU 202, and so on.

Figure 3:
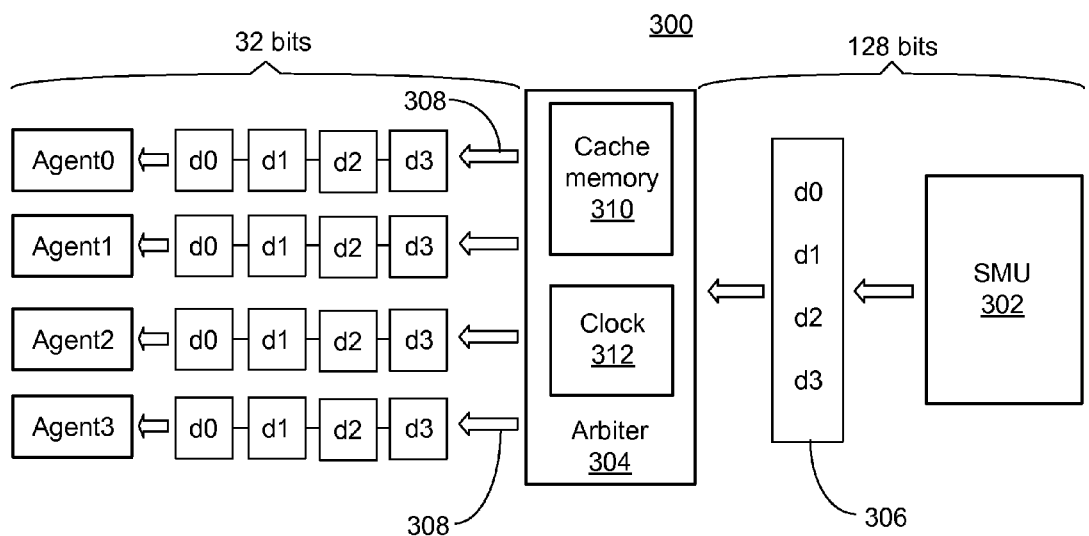
FIG. 3 is a block diagram illustrating data transfer for a process of reading data from a shared memory unit, according to some embodiments.

FIG. 3 is a block diagram illustrating data transfer in a system for a process 300 of reading data from an SMU 302, according to some example embodiments. One or more of the elements of the system illustrated in FIG. 3 may be the same as or similar to corresponding elements illustrated in system 100 of FIG. 1 and the system illustrated in FIG. 2. For example, each of agent0 through agent3 may be the same as or similar to each of agents 108. Arbiter 304 may be the same as or similar to arbiter 104. SMU 302 may be the same as or similar to SMU 102, and so on.

Though claimed subject matter is not limited to any particular bus width or processor bandwidth, process 300 is a particular example implementation where a memory bus 306 is 128 bits wide, each of agent0 through agent3 has a bandwidth of 32 bits, and each of agent buses 308 is 32 bits wide. In other words, each of agent0 through agent3 reads and processes data that is 32 bits wide.

In process 300, SMU 302 is storing data to be read by each of agent0 through agent3. The stored data may be read one data packet at a time. In the present example embodiment, one data packet is 128 bits wide, so that 128 parallel bits of data are read from SMU 302 at a time. Anticipating a process of arbiter 304 that partitions the 128 bits of parallel data, in FIG. 3 the first 32 bits of data are identified as d0, the second 32 bits of data are identified as d1, the third 32 bits of data are identified as d2, and the fourth 32 bits of data are identified as d3. Accordingly, during a read process, data stored in SMU 302 is placed onto a memory bus 306 in 128-bit parallel data packets comprising data d0 through d3. Even though an agent may request to read more than 128 bits of data from SMU 302, data is read 128 bits at a time, for example.

For sake of clarity, process 300 is described in particular detail for agent0. It is to be understood that the following description for agent0 applies to agent1, agent2, agent3, and any other agents that may be included in the system.

Data read for agent0 may be provided to arbiter 304 from SMU 302 in a 128-bit data packet via memory bus 306. Subsequent to receiving the 128 bits of parallel data, arbiter 304 may partition the 128 bits of parallel data into four 32-bit wide packets of parallel data d0 through d3. The packets of data d0 through d3 are successively provided to agent0 via agent bus 308. Four of such data packets are illustrated as data d0 through d3 on agent bus 308, though any number of data packets may be present at any particular time on agent bus 308. Thus, agent0 may receive read data d0 (32 bits) followed by read data d1 (32 bits), and so on. In some implementations, arbiter 304 may include a cache memory 310 to receive and temporarily store read data from SMU 302 via memory bus 306 during a process of reading from SMU 302. In some implementations, cache memory 310 may store more than data d0-d3 at any particular time.

Cache memory 310 may comprise any of a number of types of volatile or nonvolatile memory.

Arbiter 304 may include a clock 312 to generate a periodic electronic signal synchronously to clock of SMU 102, which may be asynchronous with any clocks associated with agent0 or SMU 302, for example. Arbiter 304 may perform a number of processes based on the clock signal of clock 312.

Based, at least in part, on bandwidths of agent0 through agent3, arbiter 304 may be configured to control or adjust the clock or width of addressable data read from SMU 302. For example, arbiter 304 may adjust the widths of data read from SMU 302 to be 128 bits wide. Thus, one memory address may be used to uniquely identify 128 bits of data stored in SMU 302. Moreover, based, at least in part, on bandwidths of agent0 through agent3, arbiter 304 may be configured to control or adjust the width of memory bus 306. For example, arbiter 304 may read four 32-bit data packets of data d0 through d3 as a single data packet that is 128 bits wide (four multiplied by 32). Before reading the 128-bit data packet from SMU 302 and placing the 128-bit data packet onto memory bus 306, arbiter 304 may configure memory bus 306 to carry the 128-bit data packet in a single clock cycle (e.g., based on clock 310) from SMU 302 to arbiter 304. Accordingly, as in the present example embodiment, memory bus 306 may be 128 lines wide. In some implementations, the number of lines of memory bus 306 may be greater than the width of data being carried over memory bus 306. In such a case, arbiter 304 may control the number of lines of memory bus 306 to be used to carry data to/from SMU 302.

Arbiter 304 allows one agent at a time to read from SMU 302 based, at least in part, on a timeslot scheme. For example, agent1 may read from SMU 302 at timeslot 1 while agent0 accesses SMU 302 at timeslot 0. Arbiter 304 determines which of the plurality of agents is granted access to read from SMU 302 at a particular timeslot value. Timeslot value may increase every clock cycle and may loop back to 0 when a maximum value is reached. Each access period for each agent allows a particular number of parallel data bits from the agent to be read from SMU 302 via memory bus 306. In the present example embodiment, arbiter 304 allows agent0 to read data d0 through d3 from SMU 302.

Arbiter 304 receives from SMU 302 read data d0 through d3 that is configured as a single 128-bit parallel data packet. Before the 128-bit parallel data packet is placed onto agent bus 308, arbiter 304 partitions the 128-bit parallel data packet into successive four 32-bit wide parallel data packets of data d0 through d3, respectively. As illustrated in FIG. 3, the system to the left of arbiter 304 is based on 32-bit data width, while the system to the right of arbiter 304 is based on 128-bit data width.

As mentioned previously, there may be more than data d0 through d3 to be read from SMU 302 by a particular agent. For example, arbiter 304 may grant agent0 access to SMU 302 to read 128 bits of data from SMU 302. Agent0 may read additional data from SMU 302 after arbiter 304 grants other agents access to SMU 302. Thus, for example, after 128 bits of data are read from SMU 302 by agent0, arbiter 304 may grant agent1 access to SMU 302. 128 bits of data may then be read from SMU 302 by agent1. Next, after the 128 bits of data are read from SMU 302 by agent1, arbiter 304 may grant agent2 access to SMU 302. 128 bits of data may then be read from SMU 302 by agent2. Next, after the 128 bits of data are read from SMU 302 by agent2, arbiter 304 may grant agent3 access to SMU 302. 128 bits of data may then be read from SMU 302 by agent3. Next, after the 128 bits of data are read from SMU 302 by agent3, arbiter 304 may begin to repeat a cycle of granting the agents access to SMU 302 and again grant agent0 access to SMU 302. Another 128 bits of data (subsequent to the 128 bits of data already read by agent0 in the first grant cycle) may then be read from SMU 302 by agent0. Next, agent1 is granted access to SMU 302, and so on.

Figure 4:
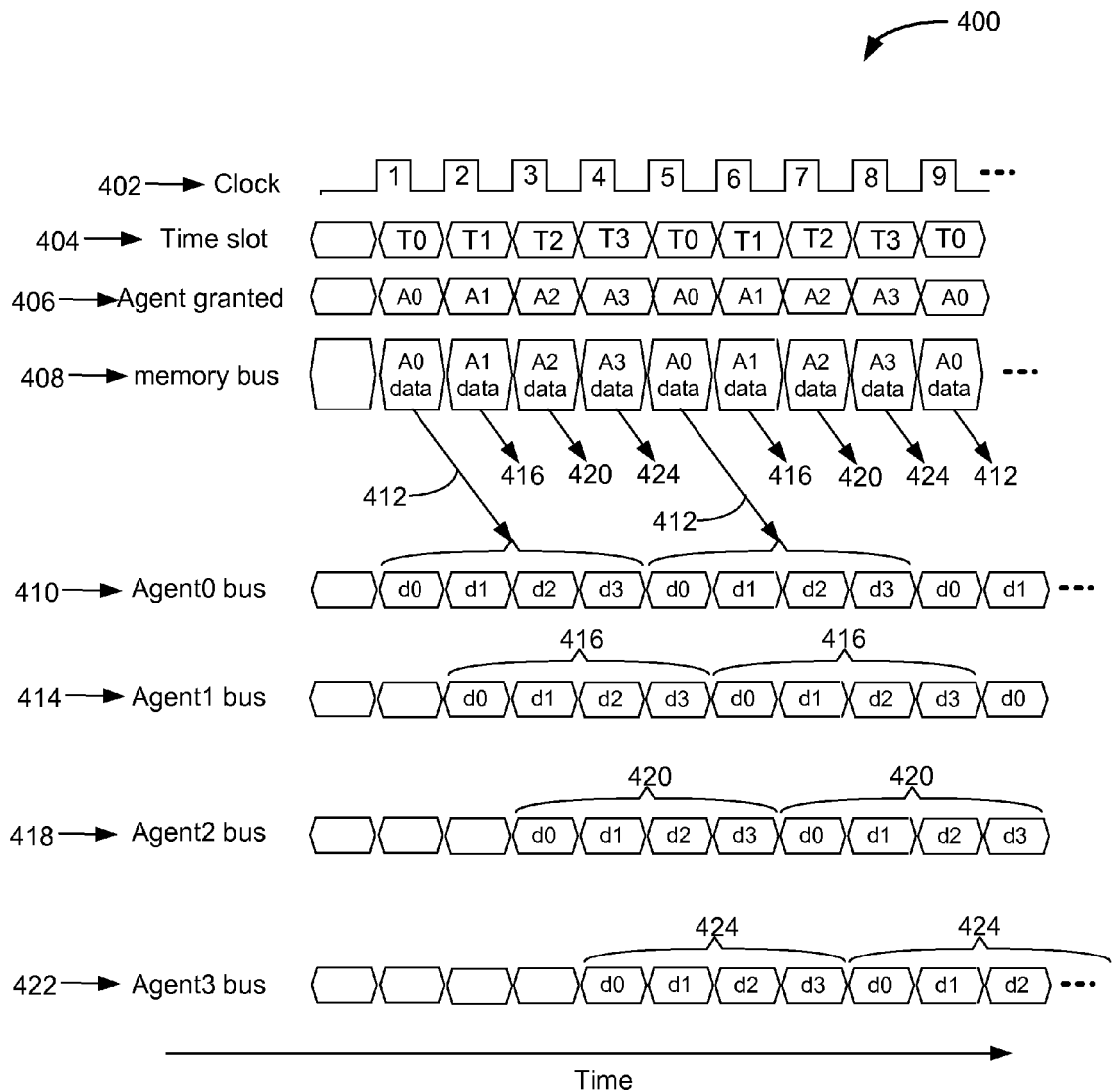
FIG. 4 is a time flow diagram illustrating a process for reading data from a shared memory unit, according to some embodiments.

FIG. 4 is a time flow diagram illustrating a process 400 for reading data from an SMU, according to some embodiments. An arbiter performing process 400 may receive information regarding bandwidths of each of a plurality of agents, such as agent0 through agent3 illustrated in FIG. 3. In some implementations, such information may be provided to the arbiter by the individual agents. For example, the arbiter may prompt an agent for the information subsequent to a connection between the arbiter and the agent in a handshake process. The arbiter may determine a sequence for selecting single agents among the plurality of agents to allow the single agents to read data from the SMU in a single clock cycle. The sequence may be based, at least in part, on the bandwidths of each of the plurality of agents. In some implementations, the arbiter may maintain a constant latency for read operations while cycling through the determined sequence.

Though process 400 may involve any bandwidth, for sake of simplifying the following description, the bandwidth of each of the agents reading data from the SMU are assumed to 32 bits. Clock signal 402 is generated by a clock circuit in, or associated with, an arbiter and memory (SMU), such as clock 312 in arbiter 304, illustrated in FIG. 3. Time slot 404 identifies the portion of a read cycle managed by the arbiter. For example, a beginning of a read cycle is at clock cycle 1 and identified as T0, the end of the read cycle is at clock cycle 4 and identified as T3, the beginning of the next read cycle is at clock cycle 5 and identified as T0, and so on. The read cycle, which includes one read cycle for each of the agents, is managed by the arbiter. Agent-granted row 406 identifies which agent is granted access to the SMU at a particular time (e.g., clock cycle). "A0" corresponds to agent0, "A1" corresponds to agent 1, and so on. For example, at time slots T0, which occur at clock cycles 1, 5, 9 . . . , agent A0 is granted access to read from the SMU. At time slots T1, which occur at clock cycles 2, 6, 10 . . . , agent A1 is granted access to read from the SMU, and so on. The sequence in which the individual agents are granted access to the SMU is determined by the arbiter based, at least in part, on the bandwidths of each of the plurality of agents (32 bits in the present example embodiment). Moreover, the arbiter may change the sequence in response to a change in a bandwidth of one or more of the plurality of agents. For example, if an agent having a first bandwidth is replaced with another agent having a second bandwidth different from the first bandwidth, the arbiter may change the sequence. In another example, if an agent is added to already present agents, the arbiter may change the sequence accordingly.

When agent A0 is granted access to the SMU at time slots T0, agent A0 reads data A0 from the SMU. Because the bandwidth of each agent A0-A3 is 32 bits, and there are four agents in the present example embodiment, A0 data stored in the SMU is 128 bits wide (32 bits multiplied by four). Thus, as described previously, 128-bit wide A0 data may be placed onto a memory bus 408, which may be the same as or similar to memory bus 306 illustrated in FIG. 3. In detail, the 128-bit wide A0 data is placed on the memory bus so that all 128 bits are in parallel, and the 128 bits occupy the memory bus for one clock cycle. In the next clock cycle, 128-bit wide A1 data, read by agent A1 will occupy the memory bus. In the third clock cycle, 128-bit wide A2 data, read by agent A2 will occupy the memory bus. In the fourth clock cycle, 128-bit wide A3 data, read by agent A3 will occupy the memory bus. In the fifth clock cycle, 128-bit wide A0 data, subsequent to the 128-bit wide A0 data read earlier in the first clock cycle, is read by agent A0 and will occupy the memory bus, and so on.

For each read cycle of the arbiter, 128-bit wide data that is on the memory bus passes to individual agent buses after the 128 bits are partitioned into four 32-bit wide data packets d0 through d3. For example, at time slots T0, 128-bit wide A0 data passes from memory bus 408 onto agent0 bus 410 as four successive 32-bit wide data packets d0, d1, d2, and d3. The arbiter manages such transfer of data from the memory bus to the agent bus. Such transfer of data is indicated by arrow 412. In another example, at time slots T1, 128-bit wide A1 data passes from memory bus 408 onto agent1 bus 414 as four successive 32-bit wide data packets d0, d1, d2, and d3. Such transfer of data is indicated by arrow-bracket pairs 416. In yet another example, at time slots T2, 128-bit wide A2 data passes from memory bus 408 onto agent2 bus 418 as four successive 32-bit wide data packets d0, d1, d2, and d3. Such transfer of data is indicated by arrow-bracket pairs 420. In still another example, at time slots T3, 128-bit wide A3 data passes from memory bus 408 onto agent3 bus 422 as four successive 32-bit wide data packets d0, d1, d2, and d3. Such transfer of data is indicated by arrow-bracket pairs 424.

The arbiter manages a process that simultaneously places read data on more than one agent data bus. For example, at clock cycle 1, the arbiter places a first 32-bit portion of A0 data, namely data packet d0, onto agent0 bus 410. At clock cycle 2, the arbiter places a first 32-bit portion of A1 data, namely data packet d0, onto agent1 bus 414 and places a second 32-bit portion of A0 data, namely data packet d1, onto agent0 bus 410. At clock cycle 3, the arbiter places a first 32-bit portion of A2 data, namely data packet d0, onto agent2 bus 418, places a second 32-bit portion of A1 data, namely data packet d1, onto agent1 bus 414, and places a third 32-bit portion of A0 data, namely data packet d2, onto agent0 bus 410. At clock cycle 4, the arbiter places a first 32-bit portion of A3 data, namely data packet d0, onto agent3 bus 422, places a second 32-bit portion of A2 data, namely data packet d1, onto agent2 bus 418, places a third 32-bit portion of A1 data, namely data packet d2, onto agent1 bus 414, and places a fourth 32-bit portion of A0 data, namely data packet d3, onto agent0 bus 410, and so on. In such a fashion, the arbiter allows the individual agents to receive and process read data while other agents are currently reading from the SMU.

Process 400 is illustrated as a particular embodiment where, as mentioned earlier, each agent has a bandwidth of 32 bits and there are four agents. Claimed subject matter is not limited in this respect. For example, a process the same as or similar to process 400 may involve any number of agents having equal or differing bandwidths.

Figure 5:
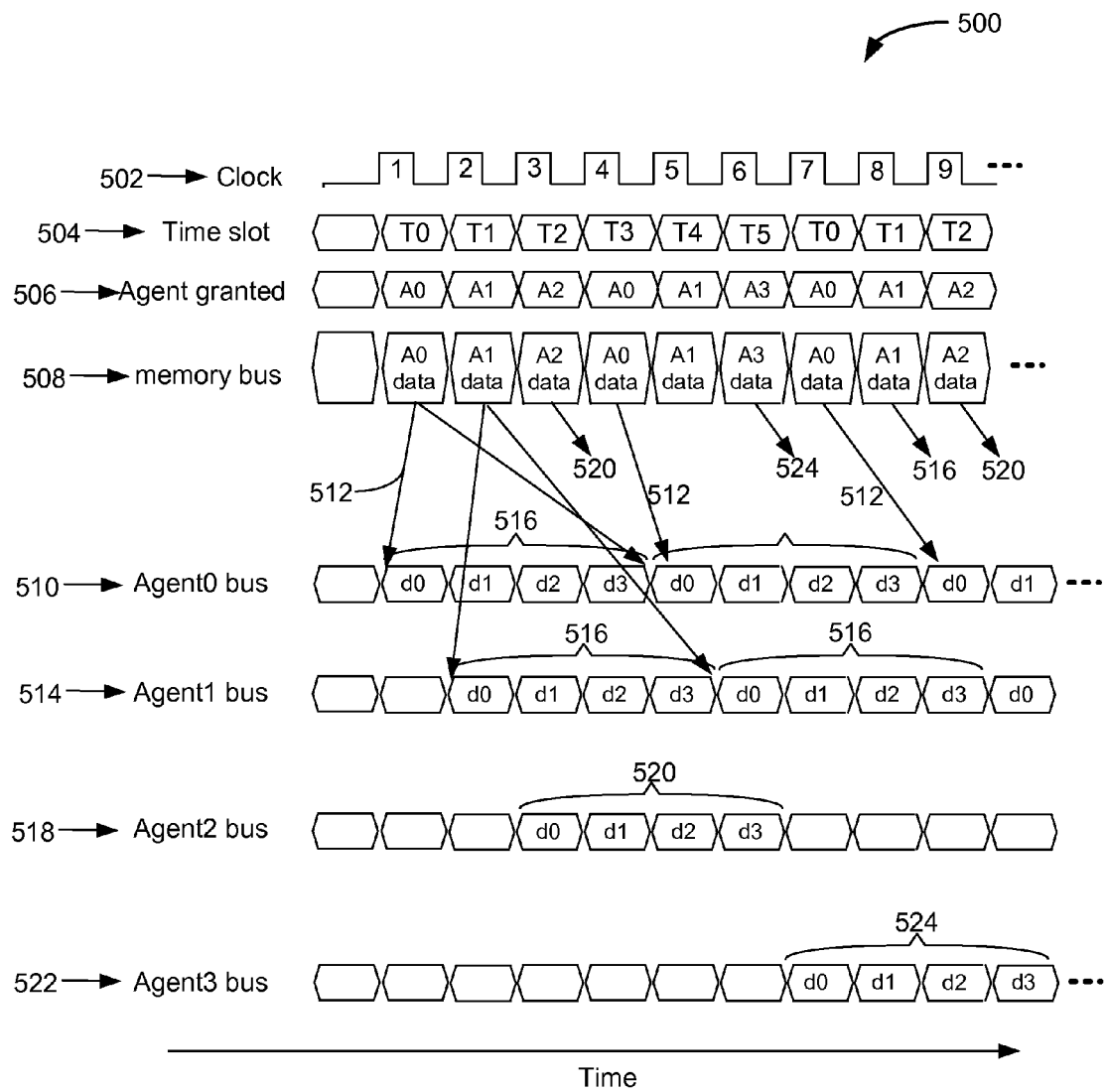
FIG. 5 is a time flow diagram illustrating a process for reading data from a shared memory unit, according to other embodiments.

FIG. 5 is a time flow diagram illustrating a process 500 for reading data from an SMU, according to some embodiments. Process 500 may be the same as or similar to process 400, except not all agents have the same bandwidth. For example, agent A0 and agent A1 may have bandwidths equal to each other and double the bandwidths of each of agents A2 and A3. In such a case, an arbiter may grant access to each of agents A0 and A1 twice as often as the amount of access granted to each of agents A2 and A3. Though process 500 may involve any combination of bandwidths and bus widths, for sake of simplifying the following description, the bandwidth of each of the agents A0 and A1 reading data from the SMU are assumed to 64 bits, the bandwidths of each of agents A2 and A3 are assumed to be 32 bits, the agent bus for each agent A0 through A3 and the memory bus are assumed to by 32 bits. Clock signal 502 is generated by a clock circuit in (or associated with) the arbiter, such as clock 312 in arbiter 304, illustrated in FIG. 3. Time slot 504 identifies the portion of a read cycle managed by the arbiter. For example, a beginning of a read cycle is at clock cycle 1 and identified as T0, the end of the read cycle is at clock cycle 6 and identified as T5, the beginning of the next read cycle is at clock cycle 7 and identified as T0, and so on. The arbiter may adjust the read cycle based, at least in part, on bandwidths of each of the agents. For example, the read cycle of process 500 includes two time slots for agent A0, two time slots for agent A1, and a single time slot for each of agents A2 and A3. Two time slots for agents A0 and A1 account for the bandwidths of agents A0 and A1 being double the bandwidths of agents A2 and A3. This is in contrast to process 400 described earlier, which involved a read cycle that included one read cycle for each of the agents, because each of the agents had bandwidths equal to one another.

Agent-granted row 506 identifies which agent is granted access to the SMU at a particular time (e.g., clock cycle). For example, at time slots T0, which occur at clock cycles 1 and 7, agent A0 is granted access to read from the SMU. At time slots T1, which occur at clock cycles 2 and 8, agent A1 is granted access to read from the SMU, and so on. The sequence in which the individual agents are granted access to the SMU is determined by the arbiter based, at least in part, on the bandwidths of each of the plurality of agents. In the present example embodiment, each of agent A0 and agent A1 have a bandwidth of 32 bits while the bandwidths of each of agents A2 and A3 are 16 bits. To optimize power, the arbiter clock frequency may be chosen to be ¾ of the clock frequency of each agent, for example. Accordingly, the sequence, as indicated in agent-granted row 506, is different from the sequence indicated in agent-granted row 406 illustrated in FIG. 4, which involves agents each having the same bandwidths. Moreover, the arbiter may change the clock frequency or the sequence in response to a change in a bandwidth of one or more of the plurality of agents. For example, if an agent having a first bandwidth is replaced with another agent having a second bandwidth different from the first bandwidth, the arbiter may change the sequence. In another example, if an agent is added to already present agents, the arbiter may change the sequence accordingly. In some implementations, the arbiter may maintain a constant latency for read operations while cycling through a determined sequence When agent A0 is granted access to the SMU at time slots T0, agent A0 reads data A0 from the SMU. In the present example, A0 data stored in the SMU is 128 bits wide. Thus, 128-bit wide A0 data may be placed onto a memory bus 508, which may be the same as or similar to memory bus 306 illustrated in FIG. 3. In detail, the 128-bit wide A0 data is placed on the memory bus so that all 128 bits are in parallel, and the 128 bits occupy the memory bus for one clock cycle. In the next clock cycle, 128-bit wide A1 data, read by agent A1 will occupy the memory bus. In the third clock cycle, 128-bit wide A2 data, read by agent A2 will occupy the memory bus. In the fourth clock cycle, 128-bit wide A0 data, subsequent to the 128-bit wide AO data read earlier in the first clock cycle, is read by agent A0 and will occupy the memory bus. In the fifth clock cycle, 128-bit wide A1 data, subsequent to the 128-bit wide A1 data read earlier in the second clock cycle, is read by agent A1 and will occupy the memory bus. In the sixth clock cycle, 128-bit wide A3 data, is read by agent A3 and will occupy the memory bus and so on.

For each read cycle of the arbiter, 128-bit wide data that is on the memory bus passes to individual agent buses after the 128 bits are partitioned into four 32-bit wide data packets d0 through d3 based, at least in part, on the agent clock. For example, at time slots T0, 128-bit wide A0 data passes from memory bus 508 onto agent0 bus 510 as four successive 32-bit wide data packets d0, d1, d2, and d3. The arbiter manages such transfer of data from the memory bus to the agent bus. Such transfer of data is indicated by arrow 512. In another example, at time slots T1, 128-bit wide A1 data passes from memory bus 508 onto agent1 bus 514 as four successive 32-bit wide data packets d0, d1, d2, and d3. Such transfer of data is indicated by arrow-bracket pairs 516. In yet another example, at time slots T2, 128-bit wide A2 data passes from memory bus 508 onto agent2 bus 518 as four successive 32-bit wide data packets d0, d1, d2, and d3. Such transfer of data is indicated by arrow-bracket pairs 520. In still another example, at time slots T5, 128-bit wide A3 data passes from memory bus 508 onto agent3 bus 522 as four successive 32-bit wide data packets d0, d1, d2, and d3. Such transfer of data is indicated by arrow-bracket pairs 524.

The arbiter manages a process that simultaneously places read data on more than one agent bus. For example, at clock cycle 1 (agent clock cycle), the arbiter places a first 32-bit portion of A0 data, namely data packet d0, onto agent0 bus 510. At clock cycle 2, the arbiter places a first 32-bit portion of A1 data, namely data packet d0, onto agent1 bus 514 and places a second 32-bit portion of A0 data, namely data packet d1, onto agent0 bus 510. At clock cycle 3, the arbiter places a first 32-bit portion of A2 data, namely data packet d0, onto agent2 bus 518, places a second 32-bit portion of A1 data, namely data packet d1, onto agent1 bus 514, and places a third 32-bit portion of A0 data, namely data packet d2, onto agent0 bus 510. At clock cycle 4, the arbiter places a second 32-bit portion of A2 data, namely data packet d1, onto agent2 bus 518, places a third 32-bit portion of A1 data, namely data packet d2, onto agent1 bus 514, and places a fourth 32-bit portion of A0 data, namely data packet d3, onto agent0 bus 510, and so on. Here the data of agent2 and agent3 take turns ({d0,d1,d2,d3} of agent3 followed {d0, d1,d2,d3} of agent2) since their bandwidth is half that of agent0 and agent1. In such a fashion, the arbiter allows the individual agents to receive and process read data while other agents are currently reading from the SMU.

Though a particular number of agents and associated bandwidths are described, process 500 may involve any number of agents having equal or differing bandwidths, and claimed subject matter is not limited in this respect.

Figure 6:
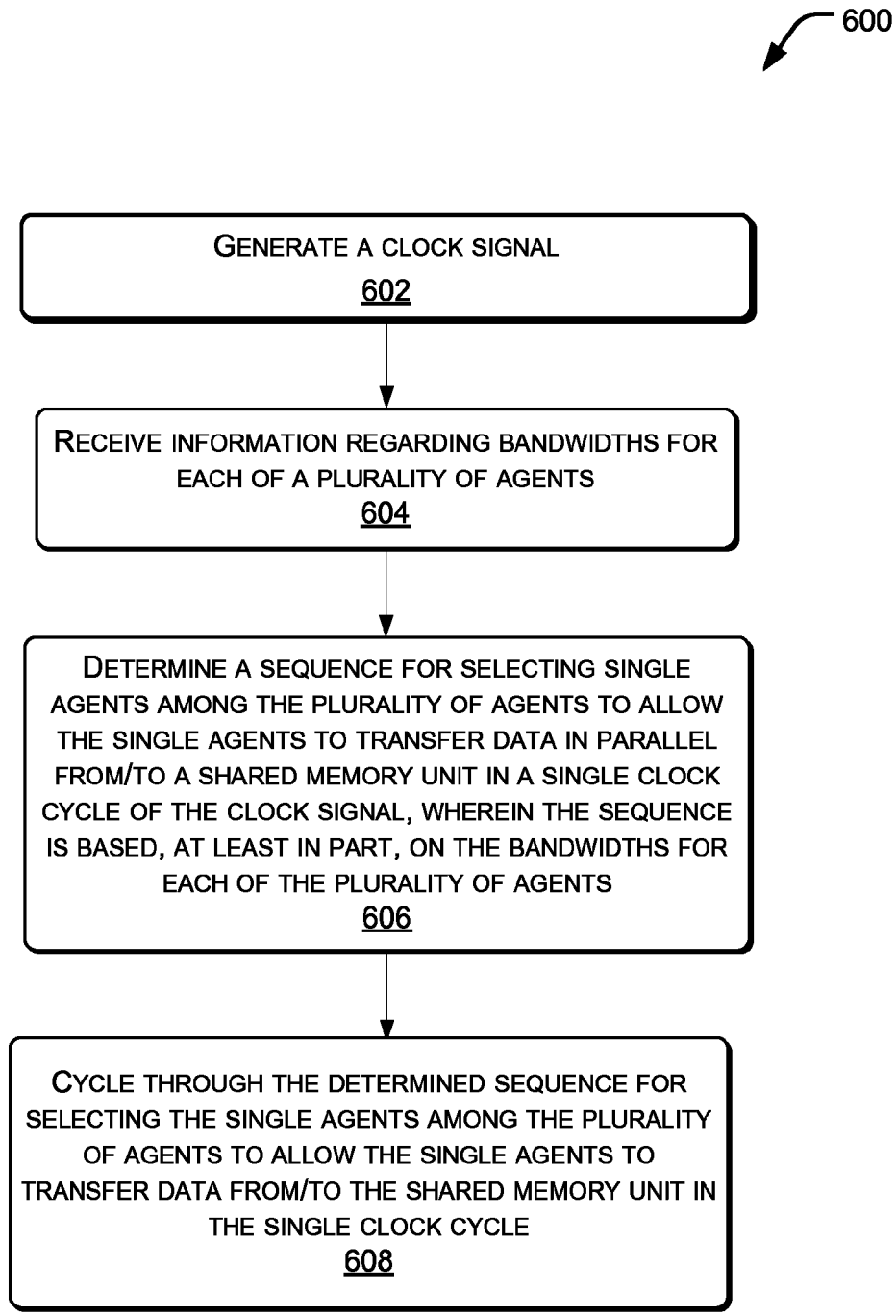
FIG. 6 is a flow diagram of a process for managing access to a shared memory unit by multiple agents, according to some embodiments.

FIG. 6 is a flow diagram of a process 600 for managing access to an SMU by multiple agents, according to some embodiments. For example, process 600 may be similar to or the same as processes 400 or 500 and performed by an arbiter such as arbiters 104, 204, or 304 illustrated in FIGS. 1, 2, and 3, respectively. The arbiter may perform process 600 based, at least in part on a clock signal generated by the arbiter, as in block 602.

At block 604, the arbiter receives information regarding bandwidths of each of a plurality of agents, such as agent0 through agent3 illustrated in FIGS. 2 and 3. In some implementations, such information may be provided by the individual agents to the arbiter. For example, the arbiter may prompt an agent for the information subsequent to a connection between the arbiter and the agent in a handshake process. In other implementations, such information may be provided to the arbiter by a user of the arbiter via an input device (not illustrated), for example.

At block 606, the arbiter determines a sequence for selecting single agents among the plurality of agents to allow the single agents to transfer data in parallel from/to the SMU in a single clock cycle of the clock signal. For example, such data transfer may involve a read operation or a write operation. The sequence may be based, at least in part, on the bandwidths of each of the plurality of agents. The arbiter can also adjust its clock frequency based, at least in part, on the overall bandwidth requirement to optimize power. At block 608, the arbiter cycles through the determined sequence, selecting single agents among the plurality of agents to allow the single agents to read from or write to the SMU in a single clock cycle.

Process 600 incorporates techniques described herein, of which one or more steps may be implemented by an arbiter, one or more processors, and/or a memory controller. This process (as well as other methods, processes, and techniques described throughout) is illustrated as a logical flow graph, each operation of which represents a sequence of operations that can be partly or wholly implemented in hardware, software, or a combination thereof. In the context of software, the operations represent computer-executable instructions stored on one or more tangible computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes. Furthermore, while the architectures and techniques described herein have been described with respect to servers and user equipment, the architectures and techniques are equally applicable to processors and processing cores in other environments and computing devices.

As used herein, the term "module" or "block" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment illustrated and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A system comprising:
    a shared memory unit; and
    an arbiter configured to
        generate a clock signal,
        receive information regarding bandwidths of each of a plurality of agents,
        determine a clock frequency or a sequence for selecting single agents among the plurality of agents to allow the single agents to transfer data in parallel from/to the shared memory unit in a single clock cycle of the clock signal, wherein the sequence is based, at least in part, on the bandwidths of each of the plurality of agents, and
        cycle through the determined sequence for selecting the single agents among the plurality of agents to allow the single agents to transfer data from/to the shared memory unit in the single clock cycle.

2. The system of claim 1, further comprising:
    an n-conductor wide parallel bus between the arbiter and the shared memory unit, wherein
        n is an integer, and
        n is based, at least in part, on the bandwidths of each of a plurality of agents.

3. The system of claim 1, wherein the arbiter is further configured to modify the number of conductors of an n-conductor wide parallel bus used for the transfer of data from/to the shared memory unit in response to a change in a bandwidth of one or more of the plurality of agents.

4. The system of claim 1, wherein the arbiter is further configured to change the clock frequency to optimize power in response to a change in a bandwidth of one or more of the plurality of agents.

5. The system of claim 1, wherein the arbiter is further configured to change the sequence in response to a change in a bandwidth of one or more of the plurality of agents.

6. The system of claim 1, wherein the arbiter is further configured to configure widths of addressable memory locations in the shared memory unit based, at least in part, on the bandwidths of each of a plurality of agents.

7. The system of claim 1, wherein the arbiter is further configured to maintain a constant worst latency for read operations while cycling through the determined sequence for selecting the single agents among the plurality of agents.

8. The system of claim 1, wherein the arbiter is further configured to arbitrate access to the shared memory unit among the plurality of agents when at least a portion of the plurality of agents have bandwidths different from bandwidths of at least another portion of the plurality of agents.

9. A method comprising:
    generating a clock signal;
    receiving information regarding bandwidths for each of a plurality of agents;
    determining a clock frequency or a sequence for selecting single agents among the plurality of agents to allow the single agents to transfer data in parallel from/to a shared memory unit in a single clock cycle of the clock signal, wherein the sequence is based, at least in part, on the bandwidths of each of the plurality of agents; and
    cycling through the determined sequence for selecting the single agents among the plurality of agents to allow the single agents to transfer data from/to the shared memory unit in the single clock cycle.

10. The method of claim 9, further comprising:
    modifying the number of conductors of an n-conductor wide parallel bus used for the transfer of data from/to the shared memory unit in response to a change in a bandwidth of one or more of the plurality of agents.

11. The method of claim 9, further comprising:
    changing the clock frequency to optimize power in response to a change in a bandwidth of one or more of the plurality of agents.

12. The method of claim 9, further comprising:
    changing the sequence in response to a change in a bandwidth of one or more of the plurality of agents.

13. The method of claim 9, further comprising:
    configuring widths of addressable memory locations in the shared memory unit based, at least in part, on the bandwidths of each of a plurality of agents.

14. The method of claim 9, further comprising:
    maintaining a constant worst latency for read operations while cycling through the determined sequence for selecting the single agents among the plurality of agents.

15. The method of claim 9, further comprising:
    arbitrating access to the shared memory unit among the plurality of agents when at least a portion of the plurality of agents have bandwidths different from bandwidths of at least another portion of the plurality of agents.

16. A computer-readable non-transitory storage medium storing computer-executable instructions that, when executed by a processor, configure the processor to perform operations comprising:
    generating a clock signal;
    determining a clock frequency or a sequence for selecting single agents among a plurality of agents to allow the single agents to transfer data in parallel from/to a shared memory unit in a single clock cycle of the clock signal, wherein the sequence is based, at least in part, on bandwidths of each of the plurality of agents; and
    cycling through the determined sequence for selecting the single agents among the plurality of agents to allow the single agents to transfer data from/to the shared memory unit in the single clock cycle.

17. The computer-readable non-transitory storage medium of claim 16, the operations further comprising:
    modifying the number of conductors of an n-conductor wide parallel bus used for the transfer of data from/to the shared memory unit in response to a change in a bandwidth of one or more of the plurality of agents.

18. The computer-readable non-transitory storage medium of claim 16, the operations further comprising:
    changing the clock frequency to optimize power in response to a change in a bandwidth of one or more of the plurality of agents.

19. The computer-readable non-transitory storage medium of claim 16, the operations further comprising:

changing the sequence in response to a change in a bandwidth of one or more of the plurality of agents.

20. The computer-readable non-transitory storage medium of claim 16, the operations further comprising:
configuring widths of addressable memory locations in the shared memory unit based, at least in part, on the bandwidths of each of a plurality of agents.

21. The computer-readable non-transitory storage medium of claim 16, the operations further comprising:
maintaining a constant worst latency for read operations while cycling through the determined sequence for selecting the single agents among the plurality of agents.

22. The computer-readable non-transitory storage medium of claim 16, the operations further comprising:
arbitrating access to the shared memory unit among the plurality of agents when at least a portion of the plurality of agents have bandwidths different from bandwidths of at least another portion of the plurality of agents.

* * * * *